United States Patent
Reyland, Jr.

(10) Patent No.: US 9,240,761 B1
(45) Date of Patent: Jan. 19, 2016

(54) POWER AMPLIFIER CALIBRATION SYSTEMS AND METHODS

(71) Applicant: John M. Reyland, Jr., Cedar Rapids, IA (US)

(72) Inventor: John M. Reyland, Jr., Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 14/201,360

(22) Filed: Mar. 7, 2014

(51) Int. Cl.
 *H03F 1/26* (2006.01)
 *H03F 3/20* (2006.01)
 *H03F 1/56* (2006.01)

(52) U.S. Cl.
 CPC ... *H03F 3/20* (2013.01); *H03F 1/56* (2013.01)

(58) Field of Classification Search
 USPC ............. 330/149, 124 R, 295, 84; 455/114.3; 375/296–297
 See application file for complete search history.

(56) References Cited

U.S. PATENT DOCUMENTS 7,737,778 B2 * 6/2010 Saed .............................. 330/149

OTHER PUBLICATIONS

Birafane et al., "Phase-Only Predistortion for LINC Amplifiers with Chireix-Outphasing Combiners", IEEE Transactions on Microwave Theory and Techniques, vol. 53, No. 6, Jun. 2005, 11 pages.

Conradi et al., "Evaluation of a Lossless Combiner in a LINC Transmitter", Proceedings of the 1999 Canadian Conference on Electrical and Computer Engineering, Shaw Conference Center, Edmonton, Alberta, Canada, May 9-12, 1999, 6 pages.

Gerhard et al., "Predistortion of Chireix Power Amplifiers", Microwave Symposium Digest, IEEE MITT-S International, 2006, pp. 1887-1890.

Hakala et al., "A 2.14 GHz Chireix Outphasing Transmitter", IEEE Transactions on Microwave Theiry and Techniques, vol. 53, No. 6, Jun. 2005, 10 pages.

* cited by examiner

*Primary Examiner* — Hieu Nguyen
(74) *Attorney, Agent, or Firm* — Angel Gerdzhikov; Donna Suchy; Daniel Barbieri

(57) ABSTRACT

Systems and methods for use in configuring a power amplifier system are provided. The method includes generating a phase error compensation signal using a phase error model configured to determine the phase error compensation signal based at least in part on an amplitude and a phase of an input signal for the power amplifier system. The phase error model is configured to estimate a time and frequency-dependent phase error in a power amplifier output signal associated with the amplitude and the phase of the input signal, and the phase error compensation signal is configured to at least partially correct the time and frequency-dependent phase error in the power amplifier output signal. The method further includes applying the phase error compensation signal to the input signal to generate a corrected input signal and providing the corrected input signal to the power amplifier system.

20 Claims, 10 Drawing Sheets

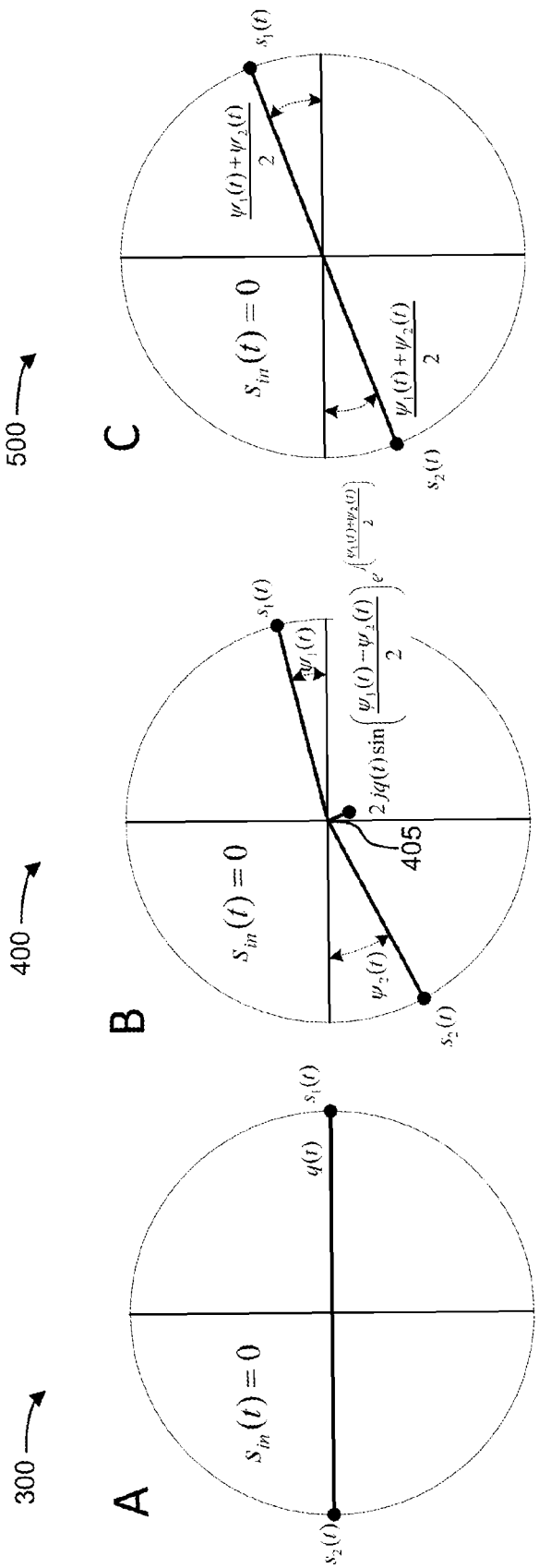

POWER AMPLIFIER CALIBRATION SYSTEMS AND METHODS

BACKGROUND

The present disclosure relates generally to the field of power amplification. More particularly, the present disclosure relates to systems and methods for providing phase error correction for power amplifier systems.

Power amplifier systems may be used in a variety of electronic applications. For example, various systems of a vehicle (e.g., aircraft), communication device, computing device, and/or other devices may utilize power amplifier systems to increase the power of an input signal. In one exemplary application, a communication system and/or navigation system of an aircraft may utilize a power amplifier system to amplify a signal being transmitted by the aircraft.

Some types of power amplifier systems may experience a frequency-dependent phase error in the generated output signal. For example, a power amplifier system that includes multiple amplifier devices with outputs coupled by a combiner may have a phase error in the output due to a frequency-varying impedance from the combiner circuit presented at the output of each amplifier device. This phase error may result in the output signal interfering with adjacent frequency channels, which may be problematic in systems where adjacent channel interference is regulated. There is a need for a system that reduces the phase error present in some power amplifier systems. Further, there is a need for a system that reduces adjacent frequency channel interference present in some power amplifier systems.

SUMMARY

One embodiment of the disclosure relates to a method of configuring a power amplifier system comprising a plurality of power amplifier devices. The method includes receiving an input signal of the power amplifier system. The power amplifier system includes a first power amplifier device configured to generate a first output signal, a second power amplifier device configured to generate a second output signal, and a combiner configured to combine the first output signal and the second output signal to generate a power amplifier output signal. The method further includes generating a phase error compensation signal using a phase error model configured to determine the phase error compensation signal based at least in part on an amplitude and a phase of the input signal. The phase error model is configured to estimate a time and frequency-dependent phase error in the power amplifier output signal associated with the amplitude and the phase of the input signal. The phase error compensation signal is configured to at least partially correct the time and frequency-dependent phase error in the power amplifier output signal. The method further includes applying the phase error compensation signal to the input signal to generate a corrected input signal and providing the corrected input signal to the power amplifier system.

Another embodiment relates to a system for configuring a power amplifier system comprising a plurality of power amplifier devices. The system includes a processing circuit configured to receive an input signal of the power amplifier system. The power amplifier system includes a first power amplifier device configured to generate a first output signal, a second power amplifier device configured to generate a second output signal, and a combiner configured to combine the first output signal and the second output signal to generate a power amplifier output signal. The electronic processor is further configured to generate a phase error compensation signal using a phase error model configured to determine the phase error compensation signal based at least in part on an amplitude and a phase of the input signal. The phase error model is configured to estimate a time and frequency-dependent phase error in the power amplifier output signal associated with the amplitude and the phase of the input signal. The phase error compensation signal is configured to at least partially correct the time and frequency-dependent phase error in the power amplifier output signal. The electronic processor is further configured to apply the phase error compensation signal to the input signal to generate a corrected input signal and provide the corrected input signal to the power amplifier system.

Another embodiment relates to one or more computer-readable storage media having instructions stored thereon. The instructions are executable by one or more processors to receive an input signal of a power amplifier system. The power amplifier system includes a first power amplifier device configured to generate a first output signal, a second power amplifier device configured to generate a second output signal, and a combiner configured to combine the first output signal and the second output signal to generate a power amplifier output signal. The power amplifier output signal is associated with a first frequency channel. The instructions are further executable to generate a phase error compensation signal using a phase error model configured to determine the phase error compensation signal based at least in part on an amplitude and a phase of the input signal. The phase error model is configured to estimate a time and frequency-dependent phase error in the power amplifier output signal associated with the amplitude and the phase of the input signal. The phase error compensation signal is configured to at least partially correct the time and frequency-dependent phase error in the power amplifier output signal. The phase error model is configured to generate the phase error compensation signal based on one or more parameters. The instructions are further executable to apply the phase error compensation signal to the input signal to generate a corrected input signal and provide the corrected input signal to the power amplifier system. The instructions are further executable to monitor an output power of the power amplifier output signal at one or more adjacent frequency channels adjacent the first frequency channel and determine values of the one or more parameters of the phase error model based on the output power at the one or more adjacent frequency channels.

BRIEF DESCRIPTION OF THE DRAWINGS

The disclosure will become more fully understood from the following detailed description, taken in conjunction with the accompanying figures, wherein like reference numerals refer to like elements, in which:

FIG. 3 is a vector diagram of signals associated with the power amplifier system shown in FIG. 1 for a null input signal when the amplifier devices are ideal voltage sources according to an exemplary embodiment;

FIG. 4 is a vector diagram of signals associated with the power amplifier system shown in FIG. 1 for a null input signal when the amplifier devices are non-ideal voltage sources according to an exemplary embodiment;

FIG. 5 is a vector diagram of signals associated with the power amplifier system shown in FIG. 1 for a null input signal when the amplifier devices are non-ideal voltage sources and a phase error correction signal applied to the input signal according to an exemplary embodiment;

DETAILED DESCRIPTION

Figure 1:
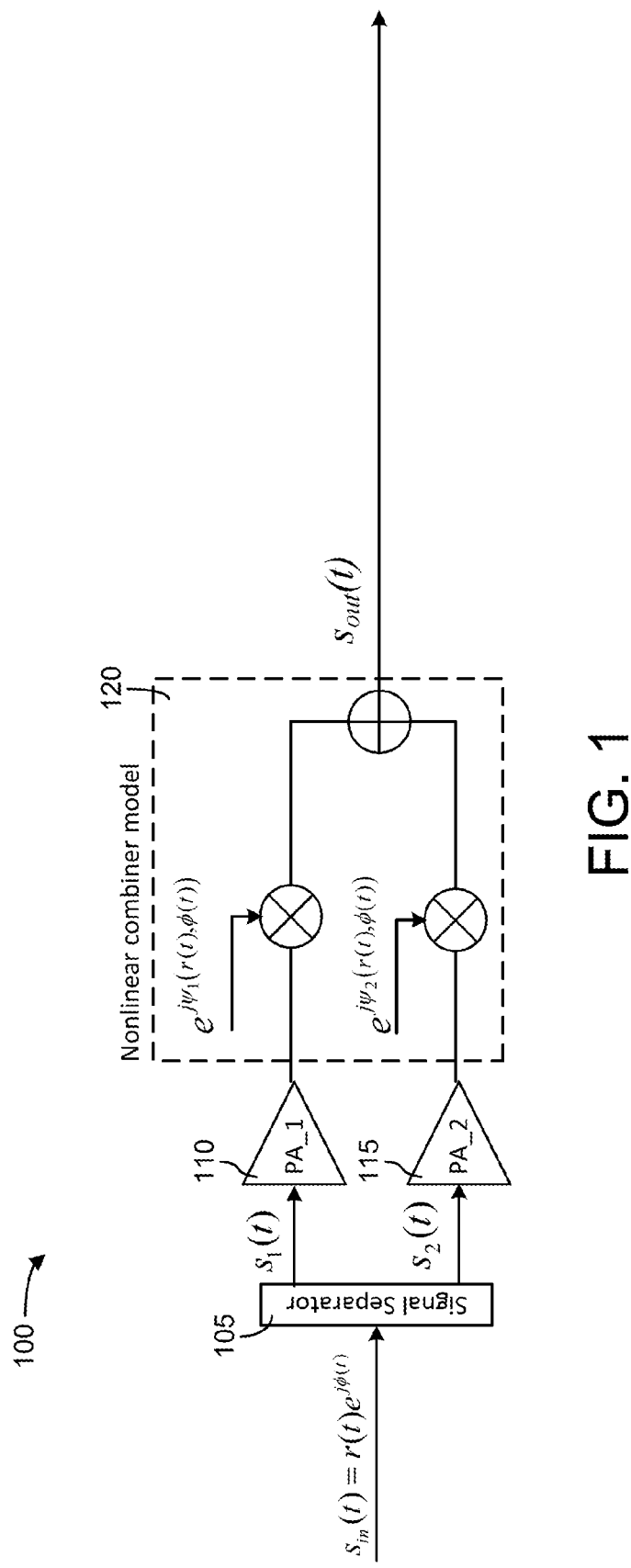
FIG. 1 is a block diagram of a power amplifier system model according to an exemplary embodiment.

Before turning to the figures, which illustrate the exemplary embodiments in detail, it should be understood that the application is not limited to the details or methodology set forth in the description or illustrated in the figures. It should also be understood that the terminology is for the purpose of description only and should not be regarded as limiting.

Referring generally to the figures, systems and methods that may be used to at least partially correct a phase error in the output of a power amplifier system are provided according to various exemplary embodiments. Some power amplifiers have constructions that can cause a phase error to be introduced in the output signal of the power amplifier that can cause the amplifier to perform in a non-ideal manner and introduce interference in adjacent frequency channels. For example, a LINC (Linear Amplification using Nonlinear Components) power amplifier generates a non-constant envelope output by combining two constant envelope signals generated by separate amplifier devices. In some embodiments, such an amplifier may utilize an out-phasing modulation technique in which amplitude modulated signals are produced by the vector summation of the two constant envelope, variable phase difference outputs of two high-efficiency power amplifier devices (e.g., devices with a high ratio of RF output power to DC input power). In some embodiments, the power amplifier system may utilize a Chireix combiner to combine the two power amplifier output signals in a lossless circuit. A conventional Chireix combiner may have been adequate for some analog amplitude modulation implementations (e.g., some voice and/or music applications). However, a dynamic range limitation related to a phase error in the output circuit prevents the application of such a circuit to many modern digital signals.

Many modern digital signals are subject to channel allocation guidelines stating that the digital signals should be transmitted within tightly-spaced allocated frequency channels, and should limit emissions in adjacent frequency channels. For example, a standard for a particular type of communication signal may allocate a frequency range of 9-11 MHz to the type of signal, and may state that the power of the signal outside of that frequency range should be no greater than five percent of the power at the signal at the center frequency of 10 MHz. To reduce adjacent channel emissions to zero or near-zero, an out-phasing amplifier system may rely on antipodal cancellation of the outputs of the individual power amplifier devices. A frequency-dependent phase error inherent to some types of combiners, such as the Chireix combiner circuit, may interfere with this cancellation. For example, the impedance that the Chireix combiner circuit presents to each power amplifier device output varies with input signal amplitude and frequency. Because the power amplifier devices are not ideal voltage sources, this impedance variation results in an amplitude and frequency-dependent phase error introduced at each output.

The present disclosure provides systems and methods that are configured to at least partially correct the phase error present in some power amplifier systems. A phase correction circuit may be configured to receive an input signal of the power amplifier system. The phase correction circuit may generate a phase error compensation signal to correct the phase error using a phase error model based on the phase of the input signal. In some embodiments, the phase error compensation signal may also be generated based on the amplitude of the input signal. In some embodiments, the phase error model may be a nonlinear model configured to compute a time-varying estimate of the phase error at the power amplifier output based on the phase and amplitude of the input signal. In some embodiments, the phase error model may be a linear model, such as a set of data associated with discrete frequencies from which additional data points can be obtained using linear interpolation. The phase correction circuit may apply the phase error compensation signal to the input signal before it is provided to the power amplifier system to generate a corrected input signal. The corrected input signal may be provided to the power amplifier system, and may cause at least a partial correction of the phase error between the output signals from the individual power amplifier devices.

In some implementations, the phase correction circuit may be configured to determine and/or adjust parameters of the phase error model based on the output signal of the power amplifier system. For example, the phase correction circuit may monitor an output power of the power amplifier output signal at one or more adjacent frequency channels. The phase correction circuit may determine and/or adjust the parameters of the model based on the output power at the adjacent frequency channels. In some embodiments, adjusting the parameters based on the power output at the adjacent frequency channels may allow the phase correction circuit to modify the phase error model (e.g., dynamically) to reduce the adjacent channel interference. This may help the phase correction circuit adapt to changes in characteristics of the input signal and/or components of the system to reduce the adverse impact of such changes to the adjacent channel interference of the power amplifier system.

Referring now to FIG. 1, a block diagram of a power amplifier system 100 model (e.g., a LINC power amplifier model) is shown according to an illustrative implementation. An input signal $s_{in}(t)$ is received at a signal separator 105 configured to split the input signal into two signal components $s_1(t)$ and $s_2(t)$. Signal $s_1(t)$ is transmitted to a first power amplifier device 110, and signal $s_2(t)$ is transmitted to a second power amplifier device 115. The output of each power amplifier device 110, 115 is fed into a nonlinear combiner circuit 120 (e.g., a Chireix combiner circuit) configured to combine the individual outputs into a combined power amplifier system output signal $s_{out}(t)$.

Figure 2:
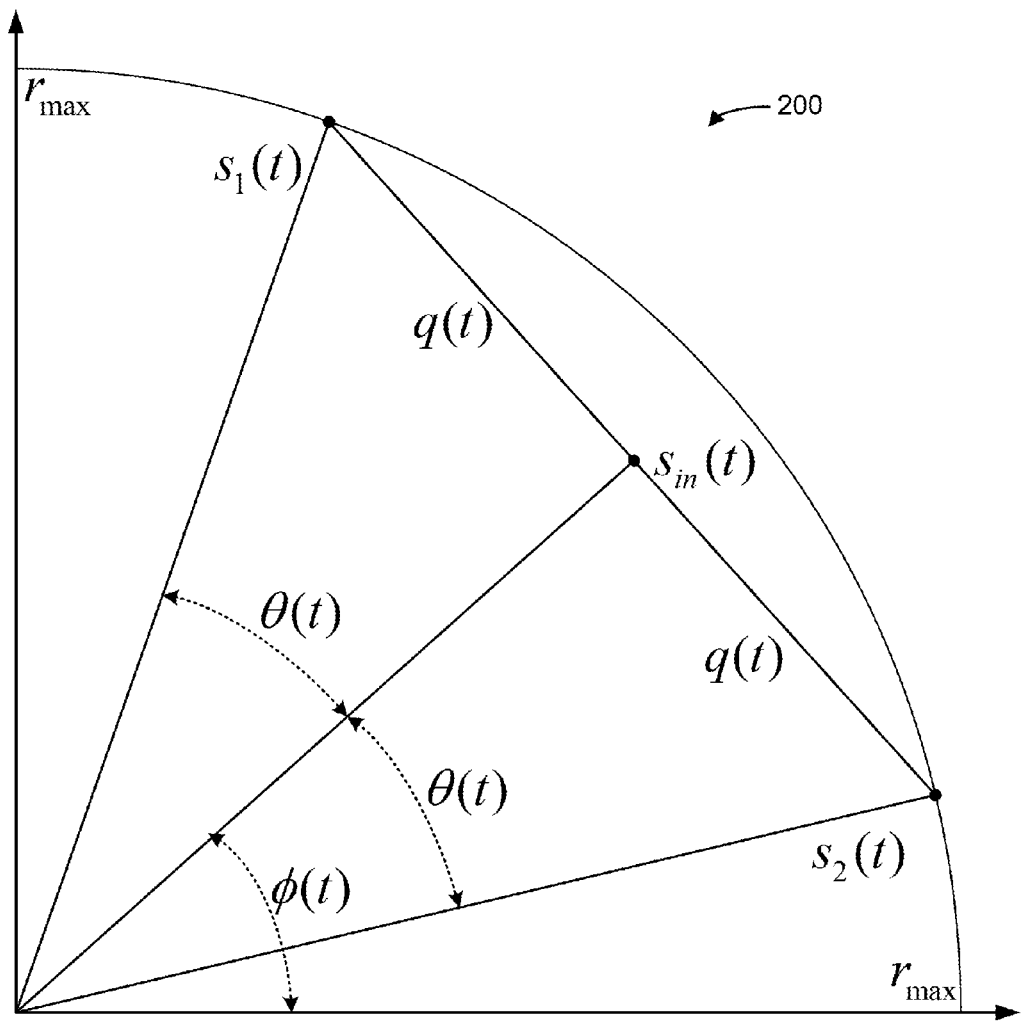
FIG. 2 is a vector diagram of signals associated with the power amplifier system shown in FIG. 1 according to an exemplary embodiment.

In power amplifier system 100 as shown in FIG. 1, system output signal $s_{out}(t)$ includes a time and frequency-dependent phase error that varies based on the phase of the input signal $s_{in}(t)$. FIG. 2 illustrates a vector diagram 200 of signals associated with power amplifier system 100 according to an exemplary embodiment. In the exemplary illustration shown in FIG. 2, $\phi(t)$ represents a phase angle of $s_{in}(t)$, and $\theta(t)$ represents an out-phasing angle of the $s_1(t)$ and $s_2(t)$ signals from input signal $s_{in}(t)$. Given the amplitude and phase modulated input of FIG. 2:

$$s_{in}(t) = r(t)e^{j\phi(t)}$$

$$s_{in}(t) = r(t)e^{j\phi(t)}$$

$$r_{max} = \max_{0 \le t < \infty} [r(t)]$$

Out-phasing angle $\theta(t)$ may be defined as follows:

$$\theta(t) = \cos^{-1}\left(\frac{r(t)}{r_{max}}\right), 0 \le r(t) \le r_{max}, 0 \le \theta(t) \le \frac{\pi}{2}$$

Assuming $r_{max}=1$, out-phasing vectors $s_1(t)$ and $s_2(t)$ may be represented as follows:

$$s_1(t) = e^{j(\phi(t)+\theta(t))}, s_2(t) = e^{j(\phi(t)-\theta(t))}$$

Without loss of generality, we assume a gain of 2 to simplify FIG. 2, this construction results in:

$$s_{out}(t) = s_1(t) + s_2(t) = 2\cos(\theta(t))e^{j\phi(t)}$$

It should be noted that, as $r(t) \to 0$, $\theta(t) \to \pi/2$, and $s_{out} \to 0$. An alternate construction of $s_{out}$ is:

$$s_{out}(t) = s_1(t) + s_2(t) = s_{in}(t) + q(t) + s_{in}(t) - q(t) = 2s_{in}(t)$$

$\psi_1(r(t),\omega(t)) = \psi_1(t)$ and $\psi_2(r(t),\omega(t)) = \psi_2(t)$ represent small, undesired dynamic amplitude and phase-dependent phase perturbations to the output signals of power amplifier devices 110 and 115, respectively. Introducing these phase perturbations into the $s_{out}(t)$ equations above, the phase-perturbed output signal may be represented as:

$$s'_{out}(t) = s_1(t)e^{j\psi_1(t)} + s_2(t)e^{j\psi_2(t)}$$

$$s'_{out}(t) = (s_{in}(t)+q(t))e^{j\psi_1(t)} + (s_{in}(t)-q(t))e^{j\psi_2(t)}$$

By multiplying each side by $$e^{-j\left(\frac{\psi_1(t)+\psi_2(t)}{2}\right)},$$

the following power amplifier system 100 output equation may be obtained:

$$s'_{out}(t)e^{-j\left(\frac{\psi_1(t)+\psi_2(t)}{2}\right)} =$$

-continued $$(s_{in}(t)+q(t))e^{j\psi_1(t)}e^{-j\left(\frac{\psi_1(t)+\psi_2(t)}{2}\right)} + (s_{in}(t)-q(t))e^{j\psi_2(t)}e^{-j\left(\frac{\psi_1(t)+\psi_2(t)}{2}\right)}$$

$$s'_{out}(t)e^{-j\left(\frac{\psi_1(t)+\psi_2(t)}{2}\right)} =$$

$$(s_{in}(t)+q(t))e^{j\left(\frac{\psi_1(t)-\psi_2(t)}{2}\right)} + (s_{in}(t)+q(t))e^{-j\left(\frac{\psi_1(t)-\psi_2(t)}{2}\right)}$$

$$s'_{out}(t)e^{-j\left(\frac{\psi_1(t)+\psi_2(t)}{2}\right)} = s_{in}(t)\left(e^{j\left(\frac{\psi_1(t)-\psi_2(t)}{2}\right)} + e^{-j\left(\frac{\psi_1(t)-\psi_2(t)}{2}\right)}\right) +$$

$$q(t)\left(e^{j\left(\frac{\psi_1(t)-\psi_2(t)}{2}\right)} - e^{-j\left(\frac{\psi_1(t)-\psi_2(t)}{2}\right)}\right)$$

$$s'_{out}(t)e^{-j\left(\frac{\psi_1(t)+\psi_2(t)}{2}\right)} = 2\cos\left(\frac{\psi_1(t)-\psi_2(t)}{2}\right)s_{in}(t) + 2jq(t)\sin\left(\frac{\psi_1(t)-\psi_2(t)}{2}\right)$$

$$s'_{out}(t) = 2\cos\left(\frac{\psi_1(t)-\psi_2(t)}{2}\right)e^{j\left(\frac{\psi_1(t)+\psi_2(t)}{2}\right)}s_{in}(t) +$$

$$2jq(t)\sin\left(\frac{\psi_1(t)-\psi_2(t)}{2}\right)e^{j\left(\frac{\psi_1(t)+\psi_2(t)}{2}\right)}$$

The above derivation reveals that, in the illustrated exemplary embodiment, $\psi_1(t)$ and $\psi_2(t)$ cause an output phase shift equal to their average value. Considering the first term on the right side, the cosine of the average difference of $\psi_1(t)$ and $\psi_2(t)$ causes an attenuation of the desired output. If, for example, $\psi_1(t) \approx \psi_2(t)$, then $$\cos\left(\frac{\psi_1(t)-\psi_2(t)}{2}\right) \approx 1,$$

and the first term above shows only a slight attenuation of the desired output. The second term on the right shows the quadrature signal, q(t), rotated 90 degrees so it lines up with the input. For $\psi_1(t) \approx \psi_2(t)$, $$\sin\left(\frac{\psi_1(t)-\psi_2(t)}{2}\right) \approx \frac{\psi_1(t)-\psi_2(t)}{2},$$

and the second term is proportional to q(t) times the magnitude of the angular error. Thus, the second term represents "leakage" of the quadrature signal into the power amplifier system 100 output.

A signal correction factor $\alpha(t)$ may be applied to reduce the quadrature error (e.g., to at or near zero) when applied to each out-phasing branch in the following manner:

$$s'_{out}(t) = s_1(t)e^{-j\alpha(t)}e^{j\psi_1(t)} + s_2(t)e^{j\alpha(t)}e^{j\psi_2(t)}$$

Replacing $\alpha(t)$ based on $$\alpha(t) = \left(\frac{\psi_2(t)-\psi_1(t)}{2}\right),$$

the output results in zero quadrature error:

$$s'_{out}(t) = s_1(t)e^{j\alpha(t)}e^{j\psi_1(t)} + s_2(t)e^{-j\alpha(t)}e^{j\psi_2(t)}$$

$$s'_{out}(t) = (s_{in}(t)+q(t))e^{j\alpha(t)}e^{j\psi_1(t)} + (s_{in}(t)-q(t))e^{-j\alpha(t)}e^{j\psi_2(t)}$$

$$s'_{out}(t) = (s_{in}(t)+q(t))e^{j(\psi_1(t)+\alpha(t))} + (s_{in}(t)-q(t))e^{j(\psi_2(t)-\alpha(t))}$$

$$s'_{out}(t) = s_{in}(t)(e^{j(\psi_1(t)+\alpha(t))} + e^{j(\psi_2(t)-\alpha(t))}) + q(t)(e^{j(\psi_1(t)+\alpha(t))} - e^{j(\psi_2(t)-\alpha(t))})$$

$$s'_{out}(t) =$$

-continued $$s_{in}(t)\left(e^{j\left(\frac{\psi_1(t)+\psi_2(t)}{2}\right)} + e^{j\left(\frac{\psi_1(t)+\psi_2(t)}{2}\right)}\right) + q(t)\left(e^{j\left(\frac{\psi_1(t)+\psi_2(t)}{2}\right)} - e^{j\left(\frac{\psi_1(t)+\psi_2(t)}{2}\right)}\right)$$

$$s'_{out}(t) = 2e^{j\left(\frac{\psi_1(t)+\psi_2(t)}{2}\right)}s_{in}(t)$$

FIG. 3 illustrates a vector diagram 300 of signals $s_1(t)$ and $s_2(t)$ associated with power amplifier system 100 for a null input signal $s_{in}(t)$=0 when the amplifier devices are ideal voltage sources according to an exemplary embodiment. Signals $s_1(t)$ and $s_2(t)$ are antipodal and the resultant output signal is a null signal.

FIG. 4 illustrates a vector diagram 400 of signals $s_1(t)$ and $s_2(t)$ associated with power amplifier system 100 for a null input signal $s_{in}(t)$=0 when the amplifier devices are non-ideal voltage sources according to an exemplary embodiment. In the illustrated embodiment, $s_1(t)$ is perturbed by $\psi_1(t)$ and $s_2(t)$ is perturbed by $\psi_2(t)$. A vector 405 illustrates the predicted non-zero quadrature error on the power amplifier system 100 output. The "leakage" shown in FIG. 4 imposes a lower limit on the out-phasing power amplifier system 100 output. This can result in excessive adjacent channel interference (ACI). In some applications, the ACI caused by this problem may exceed an ACI allowed by applicable standards.

FIG. 5 illustrates a vector diagram 500 of signals $s_1(t)$ and $s_2(t)$ associated with power amplifier system 100 for a null input signal $s_{in}(t)$=0 when the amplifier devices are non-ideal voltage sources, as shown in FIG. 4, and a phase error correction signal is applied to input signal $s_{in}(t)$ according to an exemplary embodiment. In the illustrated embodiment, $s_1(t)$ is perturbed by $\psi_1(t)$ and corrected by $+\alpha(t)$, and $s_2(t)$ is perturbed by $\psi_2(t)$ and corrected by $-\alpha(t)$. The phase error correction signal restores the antipodal nature of signals $s_1(t)$ and $s_2(t)$, and the power amplifier system 100 output is now zero.

Figure 6:
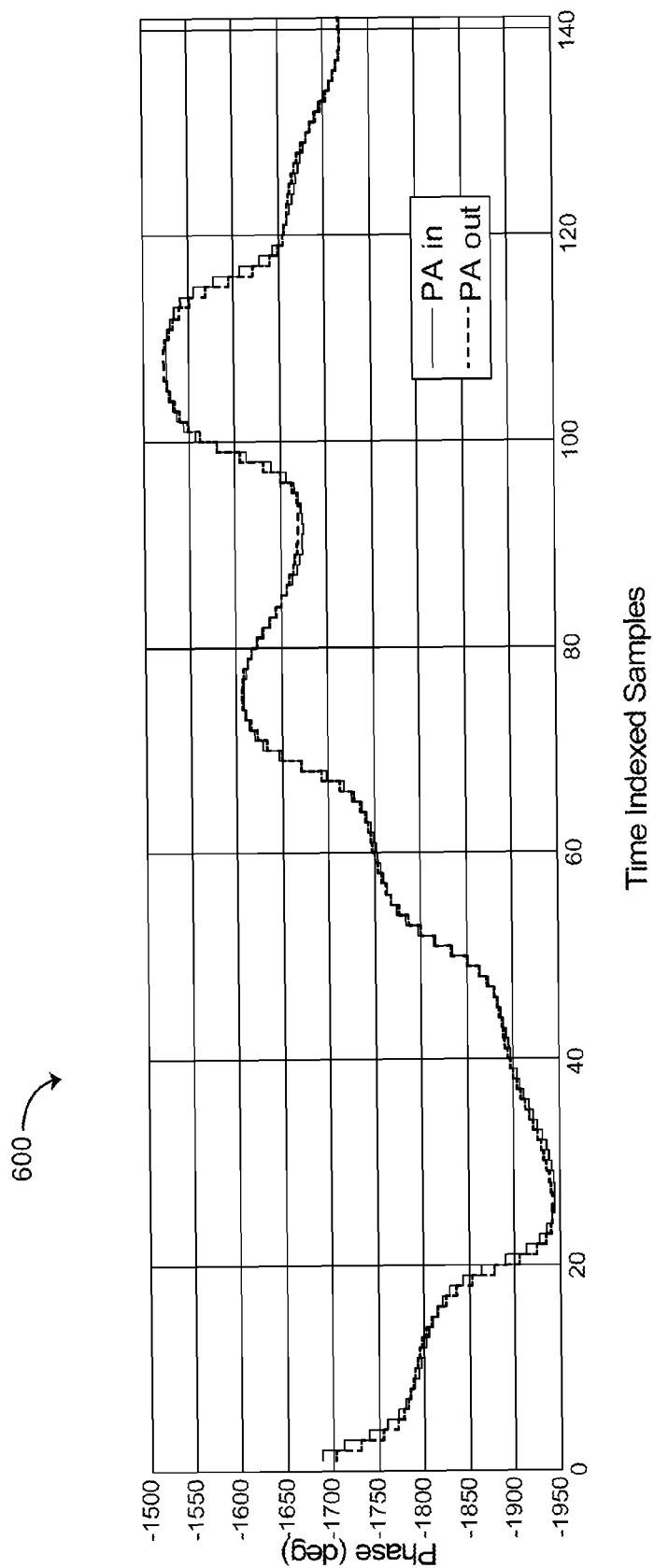
FIG. 6 is a graph showing power amplifier system input and output signals for an illustrative digital signal according to an exemplary embodiment.
Figure 7:
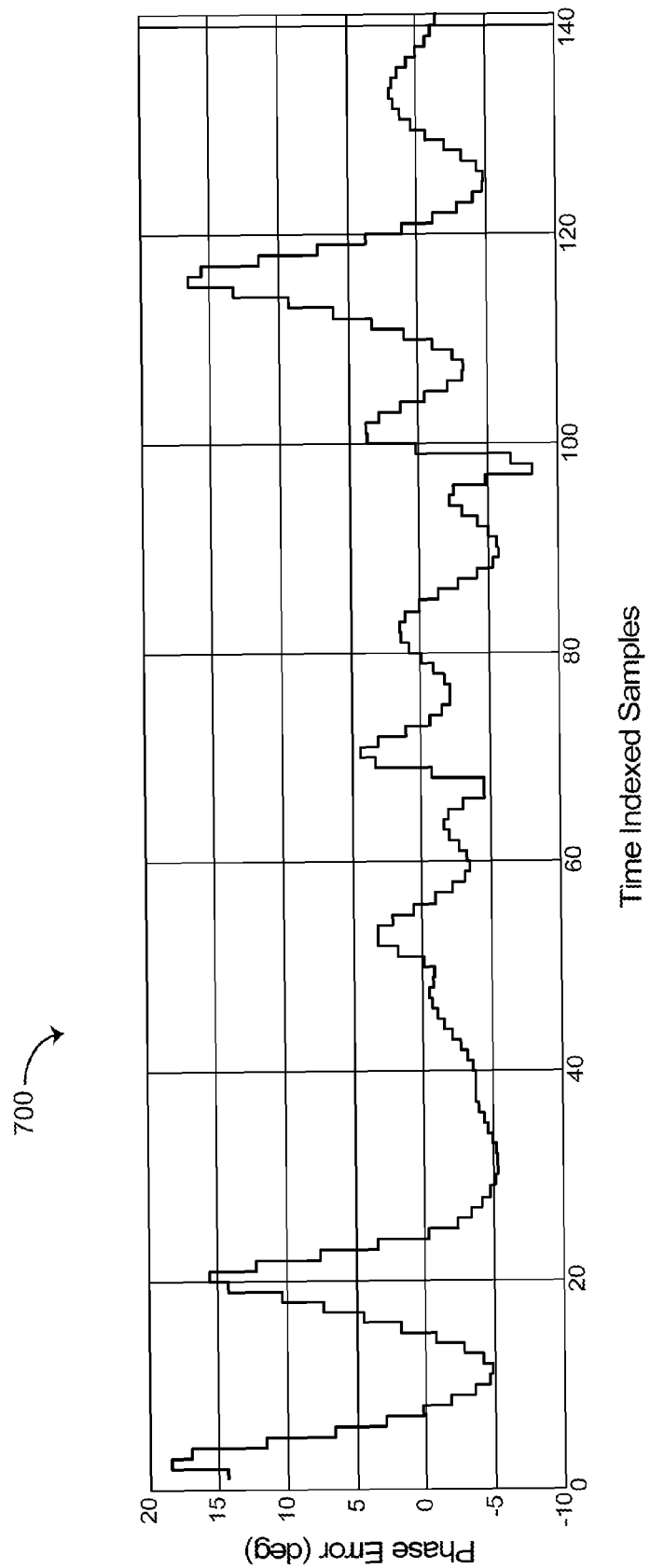
FIG. 7 is a graph of a phase error between the input and output signals shown in FIG. 6 according to an exemplary embodiment.

For at least some out-phasing power amplifiers, such as amplifier system 100, $\psi_1(t)$ and $\psi_2(t)$ are functions of input signal instantaneous amplitude and phase as well as the trajectory of amplitude and phase (in some embodiments, the perturbations may be primarily or solely the result of the phase). FIGS. 6 and 7 provide visual illustrations of resultant time and frequency-dependent phase errors for a modern complicated digital communications signal. FIG. 6 is a graph 600 illustrating power amplifier system input and output signals for the digital signal. It can be seen in graph 600 that, for some time instants, the input and output signals are more closely synchronized in phase, while, at other times, the input and output signals are fairly substantially out of phase. FIG. 7 illustrates a graph 700 showing a phase error between the input and output signals shown in FIG. 6. Specifically, in some embodiments, graph 700 may represent a plot of the average of $\psi_1(t)$ and $\psi_2(t)$. FIG. 7 provides a clear illustration of the time and frequency dependent nature of the phase error for the exemplary digital communications signal.

As shown above, a phase error correction factor $$\alpha(t) = \left(\frac{\psi_2(t) - \psi_1(t)}{2}\right)$$

may be applied to compensate for the phase error and restore the antipodal nature of the individual output signals of the amplifier devices. However, the complicated dynamic nature of $\psi_1(t)$ and $\psi_2(t)$ makes them difficult to measure, particularly in real-time or near real-time.

Figure 8:
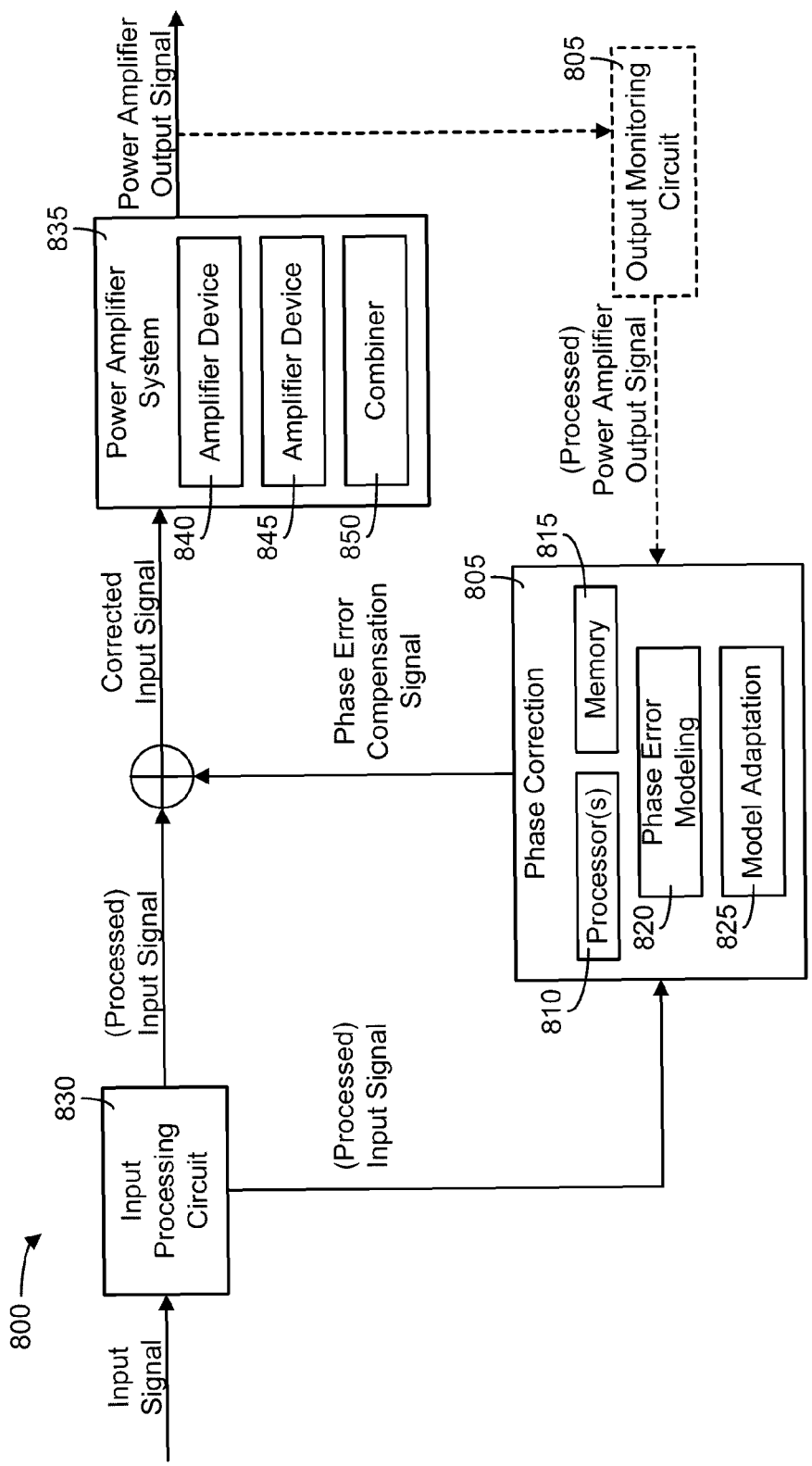
FIG. 8 is a block diagram of a system for generating a phase error compensation signal for a power amplifier system according to an exemplary embodiment.

Referring now to FIG. 8, a block diagram of a system 800 for generating a phase error correction signal for a power amplifier system 835 is shown according to an exemplary embodiment. System 800 includes a phase correction circuit 805 that may be configured to predict a phase error expected to result from an input signal and generate and apply a phase error compensation to the input signal to at least partially compensate for the expected phase error. In some embodiments, phase correction circuit 805 may be configured to apply phase error corrections in real-time or near real-time.

Phase correction circuit 805 includes one or more processors 810 and one or more memories 815. Processors 810 may include any general purpose or special purpose processor (e.g., FPGA, CPLD, ASIC, etc.). Memories 815 may include any computer or machine-readable storage medium (e.g., RAM, ROM, flash memory, etc.). Phase correction circuit 805 may include one or more modules implemented via hardware, software (e.g., computer or machine-readable instructions stored on memories 815 and configured to cause processors 810 to perform one or more actions), or a combination thereof, and configured to implement one or more functions of phase correction circuit 805.

For example, phase correction circuit 805 includes a phase error modeling module 820 configured to generate a phase error compensation signal based on an input signal. Phase error modeling module 820 is configured to receive an input signal (e.g. processed or unprocessed) from an input processing circuit 830. In some embodiments, input processing circuit 830 may be configured to perform one or more processing operations on the input signal prior to transmitting the input signal to phase correction circuit 805 and/or to power amplifier system 835. Phase error modeling module 820 may apply a model to the input signal that is configured to estimate a phase error expected to result from the input signal based on at least the phase of the input signal. In some embodiments, the model may estimate the phase error based in part on other characteristics of the input signal as well, such as the amplitude of the input signal and/or the trajectory of the amplitude and/or phase of the input signal. In some embodiments, the model may be a nonlinear model configured to compute a time-varying estimate of the phase error and generate the phase error compensation signal based on the amplitude and phase of the input signal. In some embodiments, the model may be a linear interpolation model having a set of parameters associated with discrete frequencies and/or amplitudes (e.g., stored in a lookup table), and the model may determine phase error compensation signal parameters for frequencies and/or amplitudes not represented in the data set using linear interpolation.

Phase correction circuit 805 may be configured to apply the phase error compensation signal to the input signal (e.g., via a combiner circuit/device) prior to the input signal being transmitted to power amplifier system 835. Power amplifier system 835 may receive the corrected input signal, which may have been separated into separate signals to be received by separate amplifier devices 840 and 845. The output of devices 840 and 845 may be combined using a combiner circuit 850, and combiner 850 may generate a power amplifier output signal. In some embodiments, the power amplifier output signal may include less adjacent channel interference than if the phase error compensation signal had not been applied to generate the corrected input signal.

In some embodiments, phase correction circuit 805 may be configured to utilize feedback of the power amplifier output signal to adapt (e.g., dynamically adapt) one or more parameters of the model used to generate the phase error compensation signal. A model adaptation module 825 may receive the power amplifier output signal (e.g., processed by an output monitoring circuit 855) and modify the parameters based on one or more characteristics of the output signal. For example, in some embodiments, model adaptation module 825 may monitor an output power at one or more adjacent frequency channels in the output signal (e.g., frequency channels adjacent to a dedicated frequency band associated with the input signal). Model adaptation module 825 may monitor the adjacent frequency channel power output in the output signal across varying parameters, and may select the parameters that result in a lowest output power in the adjacent frequency channels. This may help reduce the adjacent channel interference associated with power amplifier system 835 (e.g., may help avoid the adjacent channel interference exceeding acceptable levels under a standard).

Figure 9:
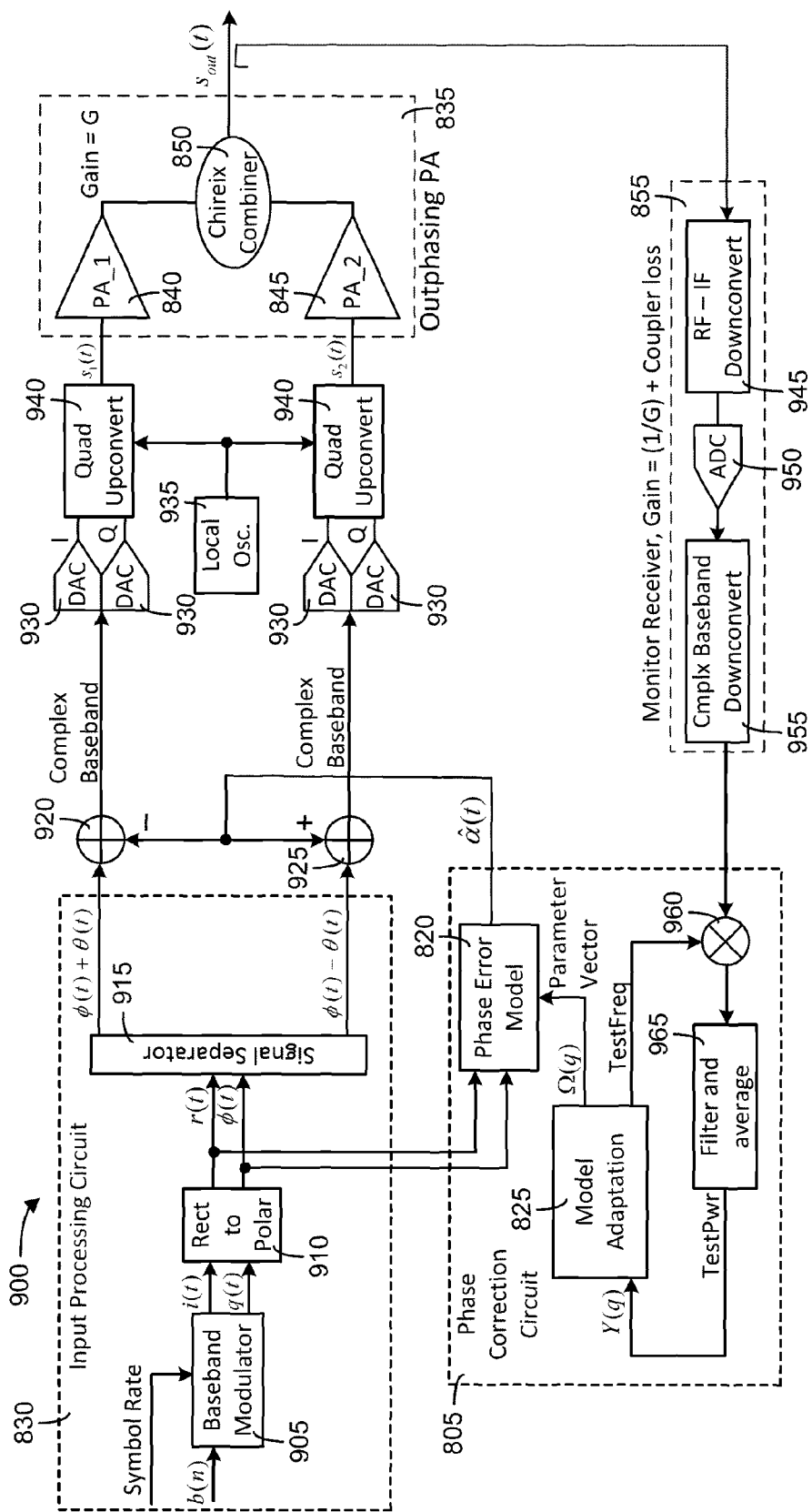
FIG. 9 is a more detailed block diagram of the system of FIG. 8 according to an exemplary embodiment.

Referring now to FIG. 9, a block diagram of a system 900 for generating a phase error compensation signal is shown according to an exemplary embodiment. System 900 may be a more detailed exemplary implementation of system 800 shown in FIG. 8.

In system 900, input processing circuit 830 includes a baseband modulator 905 configured to receive the input signal and convert the input signal into two separate signal components associated with a rectangular representation. A rectangular-to-polar conversion module 910 is configured to receive the rectangular signal components and convert the signal into a polar representation (e.g., amplitude and phase). The polar signal components are transmitted to a signal separator 915 configured to separate the input signal into separate signals to be transmitted to separate power amplifier devices 840 and 845.

Phase error modeling module 820 receives the polar representation of the input signal and generates a phase error compensation signal. Module 820 may utilize a nonlinear or linear model (e.g., a linear interpolation model) to estimate a phase error at the output of power amplifier system 835 estimated to result from the input signal, and generate the phase error compensation signal based on the estimated phase error. In some embodiments, the model may be modified or adjusted based on a parameter vector (e.g., in a closed-loop feedback embodiment). The phase error compensation signal may be applied to the separated input signals using combiners 920 and 925. The corrected input signals with the applied compensation may be transmitted to digital-to-analog (DAC) converters 930 configured to receive the digital signals and convert them into a complex baseband analog vector representation. An oscillator 935 and quad upconverter modules 940 may be used to convert the analog signals to a frequency at which the output signal is configured to operate (e.g., 10 MHz, 8 MHz, etc.). The upconverted analog signals may be transmitted to power amplifier devices 840 and 845 configured to amplify the power level (e.g., amplitude) of the signals, and the individual amplified output signal are combined using a combiner circuit 850 (e.g., a Chireix combiner) to generate a power amplifier system output signal.

In the illustrated exemplary embodiment, system 900 includes a feedback function to determine and/or modify the parameters of the model used to determine the compensation signal based on feedback from the power amplifier system output signal. Output monitoring circuit 855 (e.g., a monitor receiver circuit) includes an RF-IF downconverter 945, analog-to-digital (ADC) converter 950, and complex baseband downconverter 955 configured to process the output signal to generate a processed digital representation of the output signal. The digital representation of the output signal may be processed through a tuner 960 and filtering and averaging module 965 (e.g., a low pass filtering and averaging module).

Tuner 960 tunes the output of monitoring circuit 855 to a test frequency. Filtering and averaging module 965 may be configured to filter out portions of the output signal outside of one or more frequency ranges upon which modifications to the model are to be based (e.g., one or more adjacent frequency channels), and may average or otherwise combine the output power represented within the signal for the frequency ranges of interest (e.g., the average output power in the narrow frequency band around the test frequency). The average output power may then be provided to model adaptation module 825.

Model adaptation module 825 may determine one or more parameters of a parameter vector based on the average output power. Model adaptation module 825 may modify one or more of the parameters and observe the effect on the average output power within the monitored frequency range(s) (e.g., the adjacent frequency channels). In some embodiments, module 825 may select the parameters that result in a lowest output power level within the monitored frequency range(s). The parameter vector may be provided to phase error modeling module 820 and used to determine one or more model characteristics utilized to estimate the resultant phase error and/or generate the phase error compensation signal.

Figure 10:
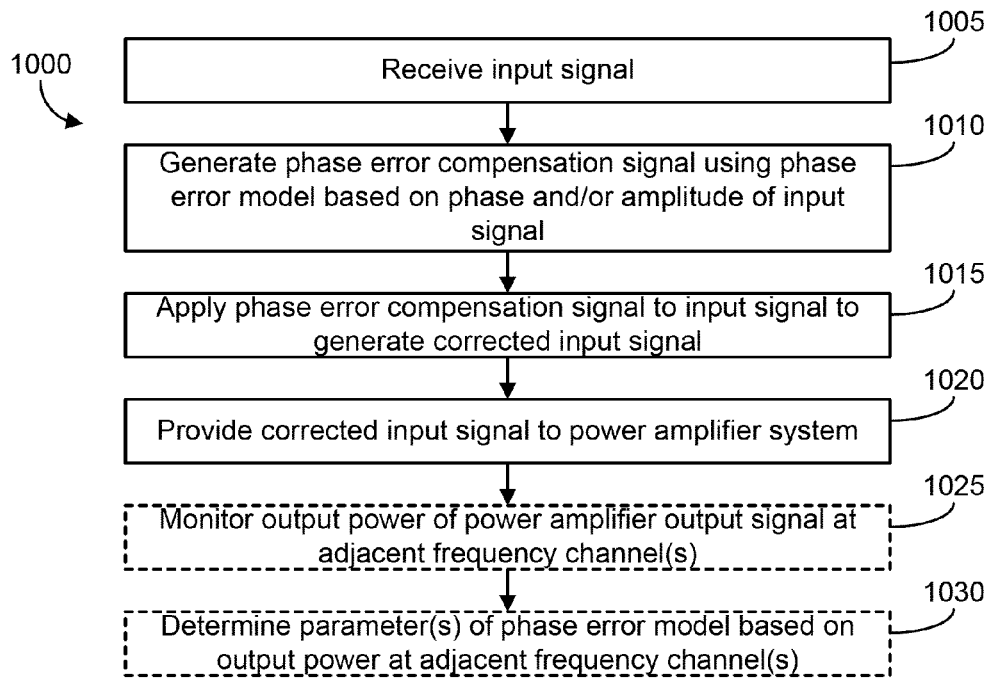
FIG. 10 is a flow diagram of a process for correcting a phase error in a power amplifier system according to an exemplary embodiment.
Figure 11:
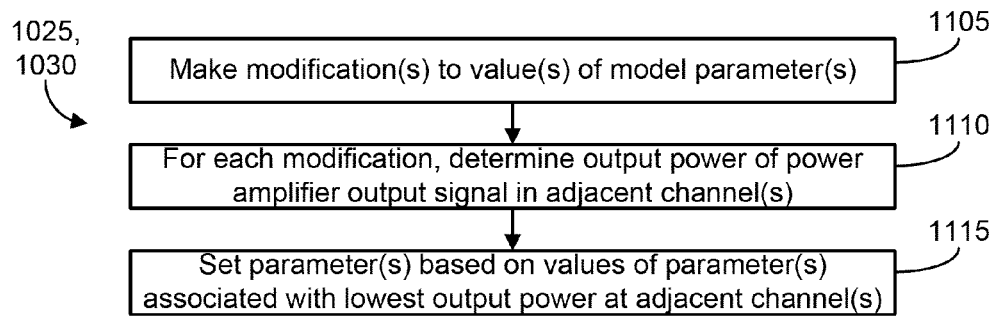
FIG. 11 is a flow diagram of a process for adjusting parameters of the phase error model used to correct the phase error in the process of FIG. 10 according to an exemplary embodiment.
Figure 12:
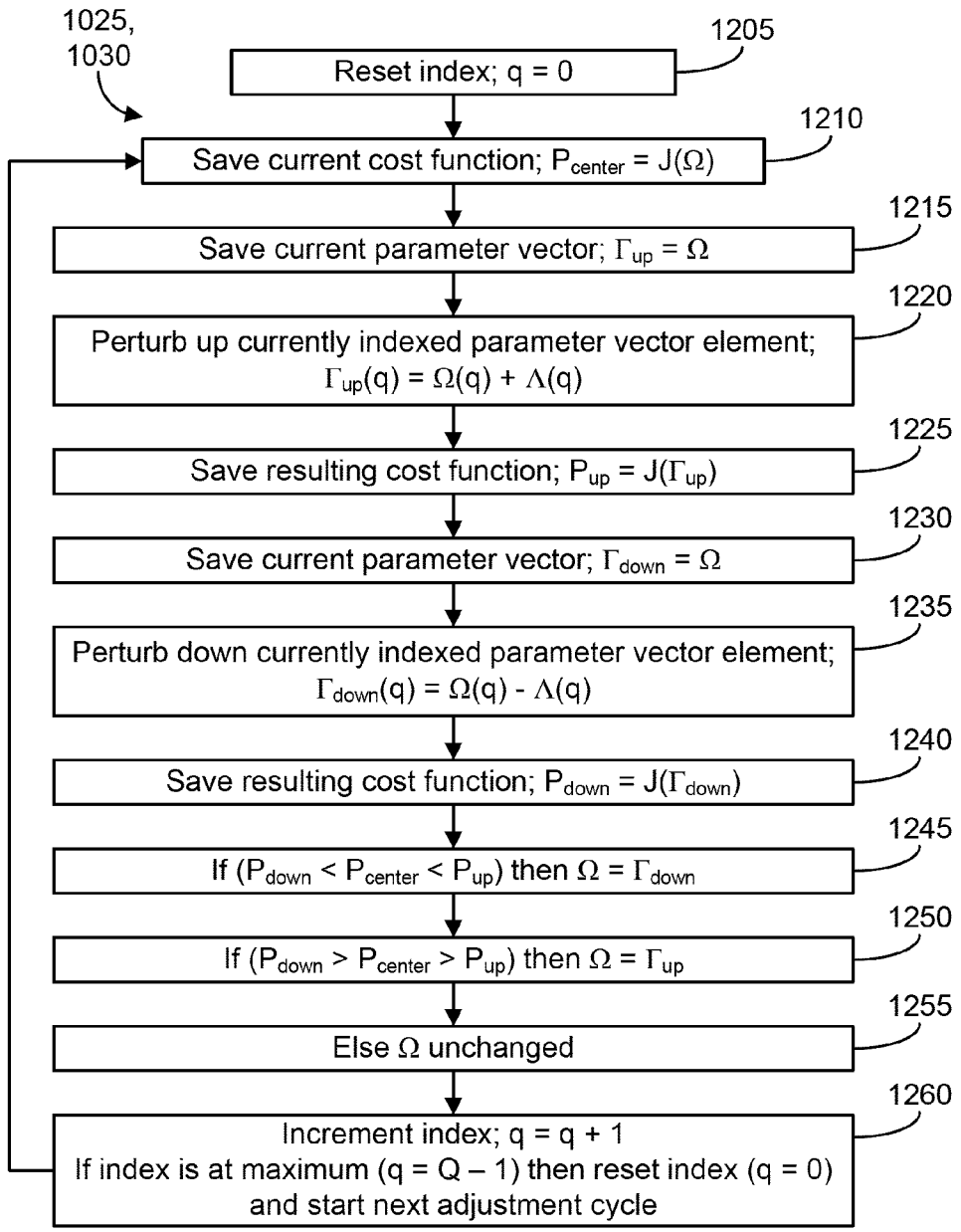
FIG. 12 is a flow diagram of a more detailed process for adjusting parameters of the phase error model used to correct the phase error in the process of FIG. 10 according to an exemplary embodiment.

FIGS. 10 through 12 illustrate flow diagrams of processes that may be used to at least partially correct a phase error in the output of a power amplifier system according to exemplary embodiments. FIGS. 10 through 12 illustrate processes that may be implemented using various components of systems 800 and/or 900, in some embodiments, and various operations shown in FIGS. 10 through 12 are described with reference to components of systems 800 and/or 900. However, it should be appreciated that, in some embodiments, different systems, devices, and/or components may be used to carry out the operations shown in FIGS. 10 through 12, and all such embodiments are contemplated within the scope of the present disclosure.

Referring now to FIG. 10, a flow diagram of a process 1000 for correcting a phase error in a power amplifier system is shown according to an exemplary embodiment. Phase correction circuit 805 may receive an input signal intended to be amplified by power amplifier system 835 (1005). In some implementations, the signal may be processed prior to being received by phase correction circuit 805 by input processing circuit 830 (e.g., processed into a polar representation).

Phase correction circuit 805 may generate a phase error compensation signal using a phase error model based on the phase and/or amplitude of the input signal (1010). The phase error model may be configured to estimate a resultant phase error that may occur at the power amplifier system 835 output based on the phase and/or amplitude of the input signal. The phase error compensation signal may be generated based on the estimated phase error and may be configured to at least partially compensate for the phase error and at least partially restore the antipodal nature of the individual power amplifier device 840, 845 outputs for null or near-null input signals.

In some embodiments, the phase error model may be a nonlinear model that computes a time-varying estimate of the phase error compensation α(t) based on the input signal phase and/or amplitude. Referring to the expressions and equations noted above with respect to FIG. 2, given $s_{in}(t) = r(t)e^{j\Phi(t)}$ and $$\alpha(t) = \left(\frac{\psi_2(t) - \psi_1(t)}{2}\right),$$

one exemplary nonlinear model may be represented as follows:

$$u_r(k) = \sum_{j=0}^{J_r-1} c_j r^j(k)$$

$$u_\phi(k) = \sum_{j=0}^{J_\phi-1} d_j \phi^j(k)$$

$$w(k) = \sum_{m=0}^{M_r-1} h_m u_r(k-m) + \sum_{m=0}^{M_\phi-1} g_m u_\phi(k-m)$$

$$\hat{\alpha}(k) = \sum_{n=0}^{N-1} b_n w^n(k)$$

This model may be referred to as a Hammerstein-Wiener model. The input is the sampled, and time-indexed by k, input signal envelope and phase. In some embodiments, the accuracy of the phase error compensation estimate $\hat{\alpha}(t)$ may be controlled by a set of one or more parameters, such as the following:

TABLE 1

HAMMERSTEIN-WIENER MODEL COEFFICIENT MATRIX

| | | | |
|---|---|---|---|
| Input Signal Envelope Polynomial Coefficients | $c_0$ | ... | $c_{J_r-1}$ |
| Input Signal Phase Polynomial Coefficients | $d_0$ | ... | $d_{J_\phi-1}$ |
| Envelope averaging coefficients | $h_0$ | ... | $h_{M_r-1}$ |
| Phase averaging coefficients | $g_0$ | ... | $g_{M_\phi-1}$ |
| Output Polynomial Coefficients | $b_0$ | ... | $b_{N-1}$ |

In some embodiments, the parameters may be represented in vector form as follows:

$$\Omega = [c_0, \ldots c_{J_r-1} d_0, \ldots d_{J_\phi-1} h_0, \ldots h_{M_r-1} g_0, \ldots g_{M_\phi-1} b_0, \ldots b_{N-1}]$$

In some embodiments, the phase error model may be implemented using a linear interpolation process based on a data set associated with a plurality of discrete frequencies. In some such embodiments, the phase error compensation estimate $\hat{\alpha}(t)$ may be measured for a set of discrete frequencies. The measurements may be taken by setting the test frequency to which output monitoring circuit 855 is tuned to each of the frequencies and measuring the average output power in the narrow band around the frequencies. The phase error compensation estimates for the set of discrete frequencies may be stored in a memory, such as in a lookup table.

In some embodiments, to calculate the phase error compensation estimate $\hat{\alpha}(t)$ in real-time or near real-time, the instantaneous frequency associated with the input signal may be mapped to a piece-wise linear approximation to the ideal frequency vs. phase error lossless combiner characteristic. Linear interpolation may be used to calculate the phase error compensation estimate $\hat{\alpha}(t)$ for values not associated with the exact frequency points represented in the set of discrete frequencies. Utilizing linear interpolation may allow for a continuous function that can be updated quickly.

Once the phase error compensation signal is generated, phase correction circuit 805 may apply the phase error compensation signal to the input signal to generate a corrected input signal (1015). In some implementations, the phase error compensation signal may be applied to separate signal components to be transmitted to the separate amplifier devices 840, 845, such as through combiner circuits. The corrected input signal may then be provided to power amplifier system 835 (1020).

In some embodiments, phase correction circuit 805 may be configured to determine and/or adjust parameters of the phase error model based on feedback from the output of power amplifier system 835. Phase correction circuit 805 may monitor the output power of power amplifier system 835 at one or more adjacent frequency channels (1025). In some embodiments, the output signal may have a designated frequency band. Phase correction circuit 805 may be configured to reduce an amount of adjacent channel interference (ACI) in one or more frequency channels adjacent the designated frequency band. For example, if the designated frequency band of the output signal is 9-10 MHz, phase correction circuit 805 may be configured to monitor the average power output in the 8-9 MHz and/or 10-11 MHz ranges. Phase correction circuit 805 may be configured to determine and/or adjust one or more parameters of the phase error model based on the output power at the adjacent frequency channel(s) (1030). In some embodiments, phase correction circuit 805 may be configured to set the parameters to values associated with a lowest output power level in the adjacent channel(s).

Referring now to FIG. 11, a flow diagram of a process for adjusting parameters of a phase error model based on output power of a power amplifier system in one or more adjacent frequency channels is shown according to an exemplary embodiment. The process shown in FIG. 11 is one exemplary implementation of operations 1025 and 1030 shown in FIG. 10.

Phase correction circuit 805 may make one or more modifications to one or more values of one or more model parameters (1105). For each modification, phase correction circuit 805 may determine the output power of the output signal from power amplifier system 835 in one or more adjacent frequency channels (1110). The modifications and power monitoring may be repeated for any number or combination of parameter values. Phase correction circuit 805 may be configured to set the parameters based on values of the parameters associated with a lowest output power in the adjacent channel(s) (1115). In some embodiments, phase correction circuit 805 may be configured to set the parameters based in part on the power output in the adjacent channel(s) and based in part on one or more other factors.

Referring now to FIG. 12, a flow diagram of a more detailed process for adjusting parameters of a phase error model based on output power of a power amplifier system in one or more adjacent frequency channels is shown according to an exemplary embodiment. The process shown in FIG. 12 is another exemplary implementation of operations 1025 and 1030 shown in FIG. 10 and/or operations 1105-1115 shown in FIG. 11.

For the parameter vector shown above in relation to the nonlinear model described with reference to operation 1010 of process 1000, the coefficients may be adjusted to minimize a cost function. The cost function may be represented as follows:

$$J(\Omega) = \sum_{q=0}^{Q-1} Y_{low}(q) + \sum_{q=0}^{Q-1} Y_{high}(q)$$

Figure 13:
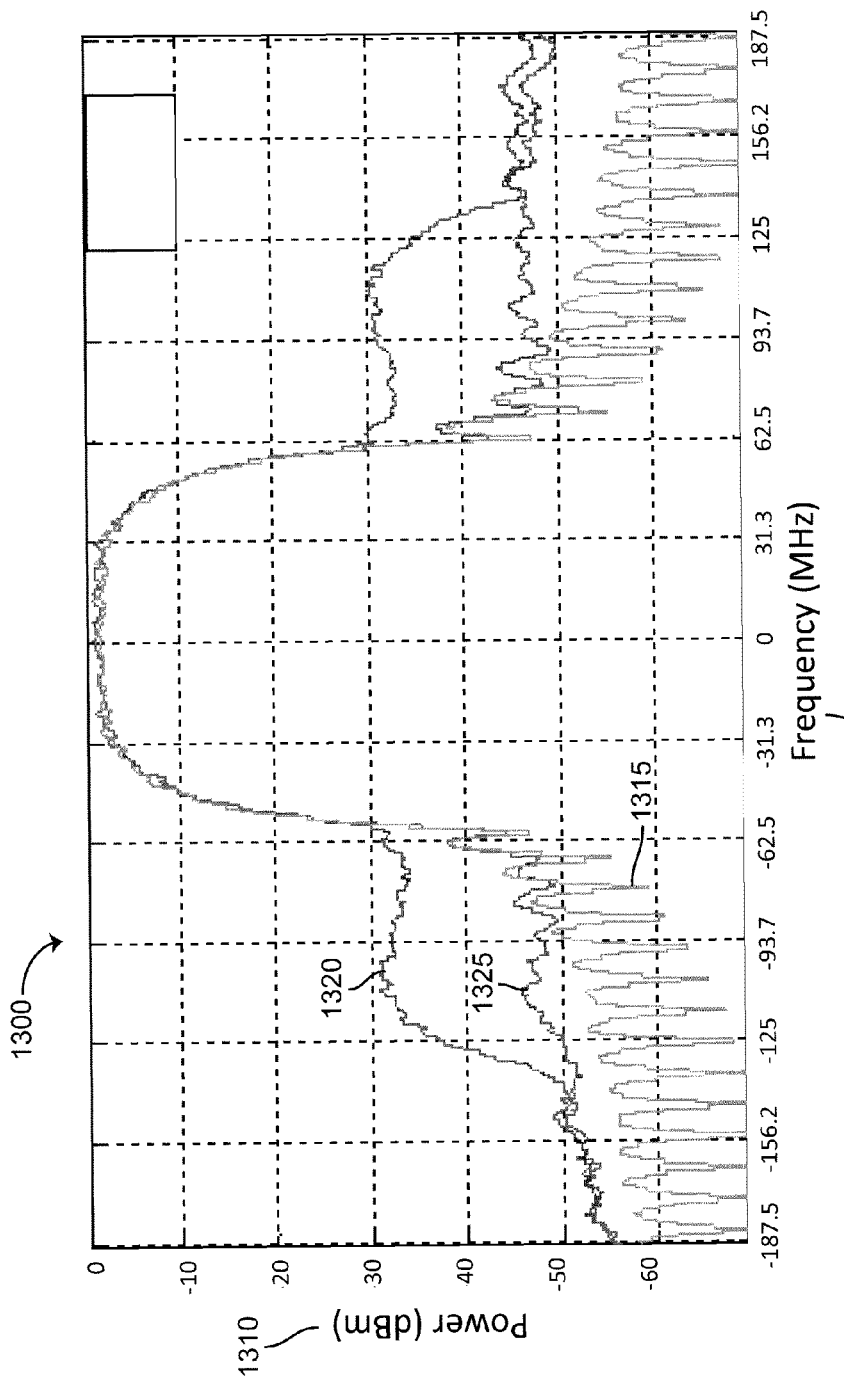
FIG. 13 is a graph illustrating power output of a power amplifier circuit across a range of frequencies for an ideal power amplifier circuit and a non-ideal power amplifier circuit, with and without phase error correction, according to an exemplary embodiment.

The first term on the right side is the average power at the output of a bandpass filter centered on the adjacent channel frequencies below the signal carrier frequency, and the second term is the same for the adjacent channel frequencies above the signal carrier frequency. For example, FIG. 13 shows low and high adjacent channel spectral regions for frequencies less than −62.5 MHz and greater than 62.5 MHz, respectively.

Referring again to FIG. 12, the illustrated process is a zero-order optimization loop for converging on a desired (e.g., optimal) value of parameter vector $\Omega$. In some implementations, the process may be implemented using a continuous series of adjustment cycles. For each cycle, one element of parameter vector $\Omega$ may be adjusted, $\Omega(q)$. Index q may start at zero and count up one every adjustment cycle until it reaches $\Omega-1$ (the length of the parameter vector), and then start back at zero. In some embodiments, every index q may select a preset perturbation $\Lambda(q)$ where $\Lambda$ is the same length as parameter vector $\Omega$.

In some embodiments, for all possible values of $\Omega$ in a Q dimensional vector space, the corresponding values of $J(\Omega)$ form a hyper plane known as a performance surface. If there is only one minimum value of $J(\Omega)$ for some optimum $\Omega$, then procedures more complicated than the process shown in FIG. 12 may be used to guarantee convergence on the optimum $\Omega$. For example, in some embodiments, a Simplex procedure may be used. Alternatively, the Genetic Algorithm might be implemented. In some embodiments, an adjustment procedure such as that shown in FIG. 12 may identify a parameter vector $\Omega$ that produces an optimum phase error compensation estimate $\hat{\alpha}(t)$ configured to result in a lowest adjacent channel interference.

Model adaptation module 825 may be configured to initially reset index q to zero (1205). Module 825 may save a current cost function, $P_{center}=J(\Omega)$ (1210), and a current parameter vector, $\Gamma_{up}=\Omega$ (1215). Module 825 may then adjust or perturb up a value of the currently indexed parameter vector element, $\delta_{up}(q)=\Omega(q)+\Lambda(q)$ (1220), and save the resulting cost function, $P_{up}=J(\Gamma_{up})$ (1225). Module 825 may save the current parameter vector, $\Gamma_{down}=\Omega$ (1230), adjust or perturb down the currently indexed parameter vector element, $\Gamma_{down}(q)=\Omega(q)-\Lambda(q)$ (1235), and save the resulting cost function, $P_{down}=J(\Gamma_{down})$ (1240).

Module 825 may then compare the cost function values for the unadjusted parameter vector element and the parameter vector elements as adjusted up and down. If the parameter vector associated with the lowest cost function value is the parameter vector resulting from the downward adjustment (e.g., if $(P_{down}<P_{center}<P_{up})$), then module 825 may set the parameter vector to the parameter vector resulting from the downward adjustment, $\Omega=\Gamma_{down}$ (1245). If the parameter vector associated with the lowest cost function value is the parameter vector resulting from the upward adjustment (e.g., if $(P_{down}>P_{center}>P_{up})$), then module 825 may set the parameter vector to the parameter vector resulting from the upward adjustment, $\Omega=\Gamma_{up}$ (1250). Otherwise, module 825 may leave the parameter vector unchanged (e.g., when the original, unadjusted parameter vector is associated with the lowest cost function value) (1255). Module 825 may increment index q (1260). In some embodiments, if index q is at a maximum value (e.g., at the length of the parameter vector, Q−1), module 825 may reset index q and begin a next adjustment cycle.

Referring now to FIG. 13, a graph 1300 illustrating power output of a power amplifier circuit across a range of frequencies for an ideal power amplifier circuit and a non-ideal power amplifier circuit, with and without phase error correction, is shown according to an exemplary embodiment. A horizontal axis 1305 represents a range of frequencies, and a vertical axis 1310 represents a power level of an output signal across the frequencies. In some embodiments, the represented signals may correspond to a raised cosine filtered 100 Mbit/second $\pi/4$ DQPSK signal.

Signal 1315 represents an ideal power amplifier circuit power output characteristic. As can be seen, in ideal operation, the circuit is designed to have a carrier frequency range between approximately −62.5 MHz and 62.5 MHz. Signal 1315 drops off steeply outside of this range.

Signal 1320 represents a non-ideal power amplifier circuit without phase error correction. Signal 1320 is similar to signal 1315 in the carrier frequency range, but has a substantially higher power output than ideal signal 1315 in the adjacent frequency ranges below −62.5 MHz and above 62.5 MHz.

Signal 1325 represents a non-ideal power amplifier circuit with phase error correction applied to the input signal. The power output of signal 1325 in the adjacent frequency ranges below −62.5 MHz and above 62.5 MHz is much lower than that of signal 1320, and much closer to that ideal operation represented by signal 1315. The difference between signals 1320 and 1325 may represent an improvement of approximately 15 dB in adjacent channel interference.

The disclosure is described above with reference to drawings. These drawings illustrate certain details of specific embodiments that implement the systems and methods and programs of the present disclosure. However, describing the disclosure with drawings should not be construed as imposing on the disclosure any limitations that may be present in the drawings. The present disclosure contemplates methods, systems and program products on any machine-readable media for accomplishing its operations. The embodiments of the present disclosure may be implemented using an existing computer processor, or by a special purpose computer processor incorporated for this or another purpose or by a hardwired system. No claim element herein is to be construed under the provisions of 35 U.S.C. §112, sixth paragraph, unless the element is expressly recited using the phrase "means for." Furthermore, no element, component or method step in the present disclosure is intended to be dedicated to the public, regardless of whether the element, component or method step is explicitly recited in the claims.

As noted above, embodiments within the scope of the present disclosure include program products comprising machine-readable storage media for carrying or having machine-executable instructions or data structures stored thereon. Such machine-readable storage media can be any available media that can be accessed by a machine with a processing circuit (e.g., processor). By way of example, such machine-readable storage media can include RAM, ROM, EPROM, EEPROM, CD ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable storage media. Machine-executable instructions include, for example, instructions and data which cause a general purpose computer, special purpose computer, or special purpose processing machine to perform a certain function or group of functions. Machine or computer-readable storage media, as referenced herein, do not include transitory media (i.e., signals in space).

Embodiments of the disclosure are described in the general context of method steps which may be implemented in one embodiment by a program product including machine-executable instructions, such as program code, for example, in the form of program modules executed by machines in networked environments. Generally, program modules include routines, programs, objects, components, data structures, etc., that perform particular tasks or implement particular abstract data types. Machine-executable instructions, associated data structures, and program modules represent examples of program code for executing steps of the methods disclosed herein. The particular sequence of such executable instructions or associated data structures represent examples of corresponding acts for implementing the functions described in such steps.

It should be noted that although the flowcharts provided herein show a specific order of method steps, it is understood that the order of these steps may differ from what is depicted. Also two or more steps may be performed concurrently or with partial concurrence. Such variation will depend on the software and hardware systems chosen and on designer choice. It is understood that all such variations are within the scope of the disclosure. Likewise, software implementations of the present disclosure could be accomplished with standard programming techniques with rule based logic and other logic to accomplish the various steps. It should also be noted that the word "component" as used herein is intended to encompass implementations using one or more lines of software code, and/or hardware implementations, and/or equipment for receiving manual inputs.

The foregoing description of embodiments of the disclosure have been presented for purposes of illustration and description. It is not intended to be exhaustive or to limit the disclosure to the precise form disclosed, and modifications and variations are possible in light of the above teachings or may be acquired from practice of the disclosure. The embodiments were chosen and described in order to explain the principals of the disclosure and its practical application to enable one skilled in the art to utilize the disclosure in various embodiments and with various modifications as are suited to the particular use contemplated.

What is claimed is:

1. A method of configuring a power amplifier system comprising a plurality of power amplifier devices, the method comprising:
receiving an input signal of the power amplifier system, wherein the power amplifier system comprises a first power amplifier device configured to generate a first output signal, a second power amplifier device configured to generate a second output signal, and a combiner configured to combine the first output signal and the second output signal to generate a power amplifier output signal;
generating a phase error compensation signal using a phase error model configured to determine the phase error compensation signal based at least in part on an amplitude and a phase of the input signal, wherein the phase error model is configured to estimate a time and frequency-dependent phase error in the power amplifier output signal associated with the amplitude and the phase of the input signal, and wherein the phase error compensation signal is configured to at least partially correct the time and frequency-dependent phase error in the power amplifier output signal;
applying the phase error compensation signal to the input signal to generate a corrected input signal; and
providing the corrected input signal to the power amplifier system.

2. The method of claim 1, further comprising:
determining one or more parameters of the phase error model based on the power amplifier output signal;
wherein generating the phase error compensation signal using the phase error model comprises generating the phase error compensation signal based at least in part on the one or more parameters of the phase error model.

3. The method of claim 2, wherein the power amplifier output signal is associated with a first frequency channel, and wherein determining the one or more parameters of the phase error model comprises:
making one or more modifications to values of at least one of the one or more parameters;
for each of the one or more modifications, determining an output power of the power amplifier output signal at one or more adjacent frequency channels adjacent the first frequency channel; and
setting the one or more parameters based on the values of the one or more parameters associated with a lowest output power at the one or more adjacent frequency channels.

4. The method of claim 3, wherein the modifications are made, the output power is determined, and the one or more parameters are set using a zero-order optimization loop.

5. The method of claim 3, wherein the modifications are made, the output power is determined, and the one or more parameters are set using a Simplex or Genetic Algorithm procedure.

6. The method of claim 3, wherein the phase error model comprises a Hammerstein-Wiener model and the one or more parameters comprise Hammerstein-Weiner model coefficients.

7. The method of claim 1, wherein the phase error model comprises a nonlinear model configured to compute a time-varying estimate of the phase error compensation signal based at least in part on the amplitude and the phase of the input signal.

8. The method of claim 1, wherein the phase error model comprises a linear interpolation model configured to generate the phase error compensation signal based on parameters associated with a set of discrete frequencies, and wherein the linear interpolation model is configured to interpolate the parameters for frequencies not included within the set of discrete frequencies.

9. The method of claim 1, wherein the power amplifier system comprises a lossless output combiner.

10. The method of claim 9, wherein the combiner comprises a Chireix combiner.

11. The method of claim 1, wherein the phase error compensation signal is generated in real-time as the input signal is received.

12. The method of claim 1, wherein the phase error compensation signal is determined based upon an amplitude of the input signal.

13. A system for configuring a power amplifier system comprising a plurality of power amplifier devices, the system comprising:
a processing circuit configured to:
receive an input signal of the power amplifier system, wherein the power amplifier system comprises a first power amplifier device configured to generate a first output signal, a second power amplifier device configured to generate a second output signal, and a combiner configured to combine the first output signal and the second output signal to generate a power amplifier output signal;
generate a phase error compensation signal using a phase error model configured to determine the phase error compensation signal based at least in part on an amplitude and a phase of the input signal, wherein the phase error model is configured to estimate a time and frequency-dependent phase error in the power amplifier output signal associated with the amplitude and the phase of the input signal, and wherein the phase error compensation signal is configured to at least partially correct the time and frequency-dependent phase error in the power amplifier output signal;

apply the phase error compensation signal to the input signal to generate a corrected input signal; and provide the corrected input signal to the power amplifier system.

14. The system of claim 13, wherein the electronic processor is configured to:

determine one or more parameters of the phase error model based on the power amplifier output signal; and generate the phase error compensation signal based at least in part on the one or more parameters of the phase error model.

15. The system of claim 14, wherein the power amplifier output signal is associated with a first frequency channel, and wherein the electronic processor is configured to determine the one or more parameters of the phase error model by:

making one or more modifications to values of at least one of the one or more parameters;

for each of the one or more modifications, determining an output power of the power amplifier output signal at one or more adjacent frequency channels adjacent the first frequency channel; and setting the one or more parameters based on the values of the one or more parameters associated with a lowest output power at the one or more adjacent frequency channels.

16. The system of claim 15, wherein the electronic processor is configured to make the modifications, determine the output power, and set the one or more parameters using a zero-order optimization loop.

17. The system of claim 13, wherein the phase error model comprises a nonlinear model configured to compute a time-varying estimate of the phase error compensation signal based at least in part on the amplitude and the phase of the input signal.

18. The system of claim 13, wherein the phase error model comprises a linear interpolation model configured to generate the phase error compensation signal based on parameters associated with a set of discrete frequencies, and wherein the linear interpolation model is configured to interpolate the parameters for frequencies not included within the set of discrete frequencies.

19. One or more computer-readable storage media having instructions stored thereon, the instructions being executable by one or more processors to:

receive an input signal of a power amplifier system, wherein the power amplifier system comprises a first power amplifier device configured to generate a first output signal, a second power amplifier device configured to generate a second output signal, and a combiner configured to combine the first output signal and the second output signal to generate a power amplifier output signal, and wherein the power amplifier output signal is associated with a first frequency channel;

generate a phase error compensation signal using a phase error model configured to determine the phase error compensation signal based at least in part on an amplitude and a phase of the input signal, wherein the phase error model is configured to estimate a time and frequency-dependent phase error in the power amplifier output signal associated with the amplitude and the phase of the input signal, wherein the phase error compensation signal is configured to at least partially correct the time and frequency-dependent phase error in the power amplifier output signal, and wherein the phase error model is configured to generate the phase error compensation signal based on one or more parameters;

apply the phase error compensation signal to the input signal to generate a corrected input signal;

provide the corrected input signal to the power amplifier system;

monitor an output power of the power amplifier output signal at one or more adjacent frequency channels adjacent the first frequency channel; and determine values of the one or more parameters of the phase error model based on the output power at the one or more adjacent frequency channels.

20. The one or more computer-readable storage media of claim 19, wherein the instructions are executable by the one or more processors to:

make one or more modifications to the values of at least one of the one or more parameters;

for each of the one or more modifications, determine the output power of the power amplifier output signal at the one or more adjacent frequency channels; and set the one or more parameters based on the values of the one or more parameters associated with a lowest output power at the one or more adjacent frequency channels.

* * * * *